(12) United States Patent
Terzioglu et al.

(10) Patent No.: US 7,710,755 B2
(45) Date of Patent: May 4, 2010

(54) DRAM ARCHITECTURE

(75) Inventors: Esin Terzioglu, Aliso Viejo, CA (US);
Gil I. Winograd, Aliso Viejo, CA (US);
Morteza Cyrus Afghahi, Coto De Caza, CA (US)

(73) Assignee: Novelics, LLC, Aliso Viejo, CA (US)

( * ) Notice: Subject to any disclaimer, the term of this patent is extended or adjusted under 35 U.S.C. 154(b) by 1 day.

(21) Appl. No.: 12/018,996

(22) Filed: Jan. 24, 2008

(65) Prior Publication Data

US 2008/0137391 A1    Jun. 12, 2008

Related U.S. Application Data

(62) Division of application No. 11/370,738, filed on Mar. 7, 2006, now Pat. No. 7,366,046.

(60) Provisional application No. 60/708,729, filed on Aug. 16, 2005.

(51) Int. Cl.
*G11C 5/06* (2006.01)

(52) U.S. Cl. .......................... 365/63; 365/222

(58) Field of Classification Search .................. 365/63, 365/222
See application file for complete search history.

(56) References Cited

U.S. PATENT DOCUMENTS

| | | | |
|---|---|---|---|
| 5,077,688 A * | 12/1991 | Kumanoya et al. | 365/149 |
| 6,266,264 B1 * | 7/2001 | Proebsting | 365/63 |
| 6,424,571 B1 * | 7/2002 | Pekny | 365/185.21 |
| 6,677,880 B2 | 1/2004 | Yamamoto | 341/169 |
| 6,757,191 B2 * | 6/2004 | Ooishi et al. | 365/171 |
| 6,903,953 B2 | 6/2005 | Khanna | |
| 6,967,856 B1 | 11/2005 | Park et al. | |
| 7,006,368 B2 | 2/2006 | Arsovski et al. | |
| 2002/0076880 A1 * | 6/2002 | Yamada et al. | 438/243 |
| 2003/0012063 A1 * | 1/2003 | Chien | 365/200 |
| 2003/0021140 A1 * | 1/2003 | Morihara et al. | 365/63 |
| 2004/0032759 A1 * | 2/2004 | Chow et al. | 365/145 |

\* cited by examiner

*Primary Examiner*—Hoai V Ho
*Assistant Examiner*—Jason Lappas
(74) *Attorney, Agent, or Firm*—Haynes & Boone, LLP.

(57) ABSTRACT

In one embodiment, a dynamic random access memory (DRAM) is provided that includes: a plurality of memory cells arranged into rows and columns, wherein each memory cell comprises an access transistor coupled to a storage transistor, each access transistor being arranged in a rectangular shape having a length greater than a width, the length being aligned with a corresponding column, the access transistor coupling to a storage transistor having a width greater than the width of the rectangular shape, the access transistor having a length aligned with a corresponding row such that each memory cell is L-shaped, and wherein the L-shaped memory cells in each column are staggered with respect to neighboring columns such that the L-shaped memory cells in a given column are interlocked with the L-shaped memory cells in an adjacent column.

11 Claims, 7 Drawing Sheets

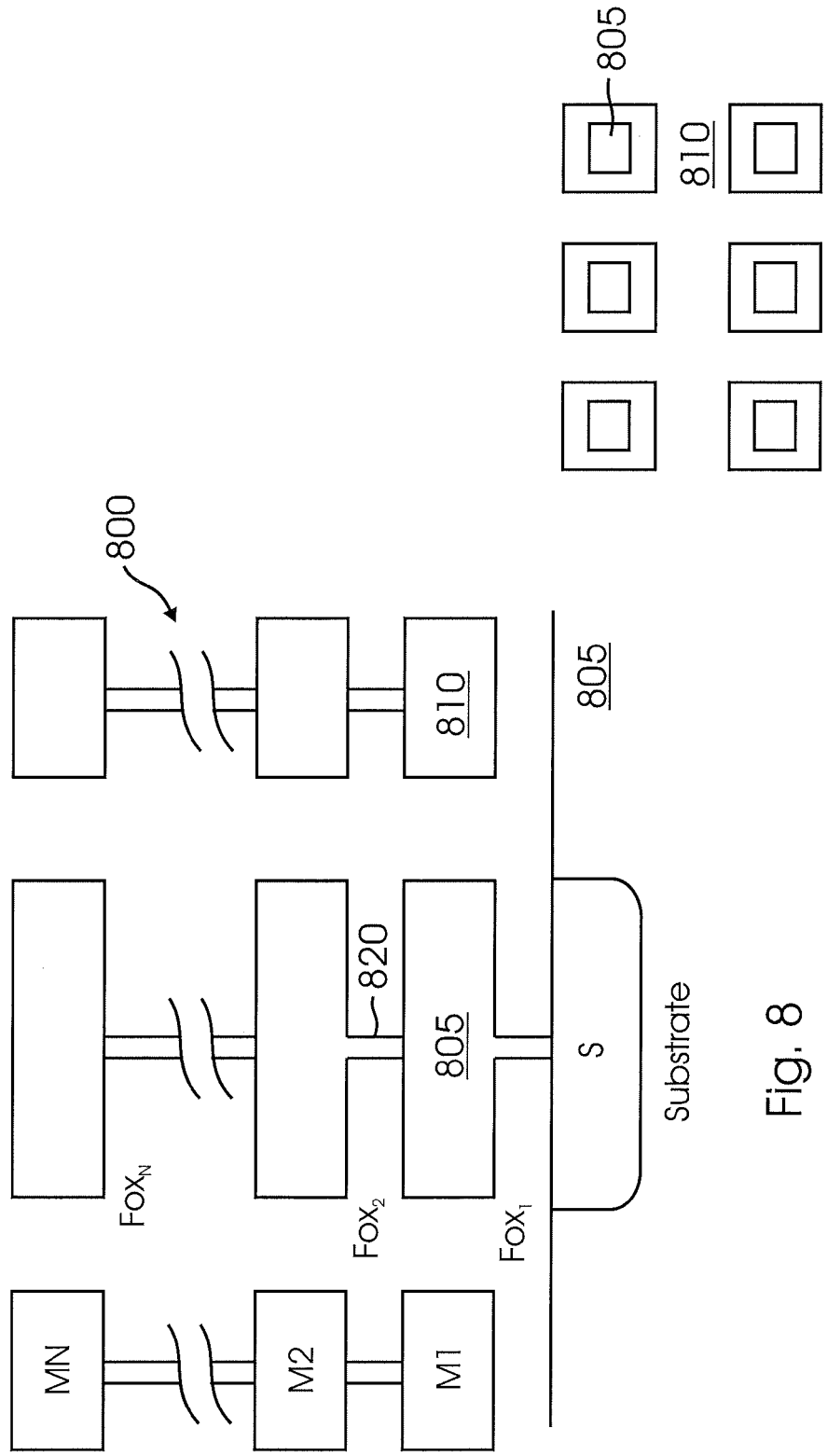

DRAM ARCHITECTURE

RELATED APPLICATION

This application is a divisional of U.S. application Ser. No. 11/370,738, filed Mar. 7, 2006, now U.S. Pat. No. 7,366,046, which in turn claims the benefit of U.S. Provisional Application No. 60/708,729, filed Aug. 16, 2005, the contents of both of which are incorporated by reference in their entirety.

BACKGROUND OF THE INVENTION

The present invention relates to memories, and more particularly to a dynamic random access memory (DRAM) architectures with increased densities.

Because a DRAM memory cell includes just a single access transistor and a storage capacitor, DRAM offers dramatic density advantages over static random access memory (SRAM), which typically requires a six transistor (6-T) memory cell. In contrast to SRAM, a DRAM cell will only change the voltage on its corresponding bit line slightly during read operations. Having been coupled to the bit line, the storage capacitor in a DRAM cell must be then be restored after a read operation. Thus, DRAM sense amplifiers require a regenerative latching ability to drive the bit line "full rail" after a read operation. If the sense amplifier determines that the storage capacitor was charged to VDD, the bit line is then driven to VDD to restore the charge on the storage capacitor. On the other hand, if the sense amplifier determines that the storage capacitor was not charged, the bit line is grounded to discharge the storage capacitor. Moreover, the charge on DRAM storage capacitors continually leaks away, requiring constant refreshing. SRAM cells require no such refreshing. In addition, because the 6-T SRAM cell can drive its value onto a bit line during read operations, SRAM is generally substantially faster than DRAM.

As a result of the density vs. speed advantages of SRAM and DRAM, SRAM is faster but more expensive and thus reserved for more time-critical operations such as a microprocessor's cache. To reduce costs, the remaining RAM for a microprocessor is then typically implemented as DRAM. However, because DRAM operation speed is constantly being improved, the use of embedded DRAM in integrated circuits is becoming more popular in high-performance applications that traditionally demanded embedded SRAM. Nevertheless, the choice between DRAM and SRAM is often guided by the density vs. speed tradeoffs discussed above. Accordingly, designers strive to increase DRAM density.

The challenges to increasing DRAM density may be better appreciated through discussion of a conventional DRAM 100 illustrated in FIG. 1. A word line WL0 controls the gate of an access NMOS transistor M0 whose drain couples to a bit line Bx. The source of access transistor M0 couples to a storage capacitor C0. Thus, access transistor M0 and storage capacitor C0 form a DRAM memory cell that is accessed by raising the voltage on word line WL0. In response to this voltage rise, any charge on capacitor C0 couples to bit line Bx. A sense amplifier reads the contents of the accessed memory cell by detecting a resulting voltage change on bit line Bx.

The sense amplifier detects the voltage change by comparing the voltage on bit line Bx to a neighboring bit line such as a bit line B. Before this comparison is made, bit lines Bx and B are pre-charged to a voltage VDD/2 by pre-charge circuitry. If the comparison indicates that bit line Bx is higher in voltage than bit line B, downstream decoding logic (not illustrated) will assume that the storage capacitor C0 had previously been charged to VDD. If the comparison indicates that bit line B is higher in voltage than bit line Bx, the decoding logic will assume that storage capacitor C0 had previously been discharged. In this fashion, a decision is made as to the binary contents of the memory cell. Having read the contents of the memory cell, the sense amplifier will restore the memory cell using a regenerative latch. An analogous access may be made to a memory cell comprised of access transistor M1 and a storage capacitor C1 by raising a word line WL1, and so on.

Each bit line has an inherent capacitance that is typically an order of magnitude greater than the capacitance of the storage capacitors. This difference in capacitance is exacerbated as the number of memory cells accessible by a sense amplifier is increased. For example, should DRAM 100 be first implemented with an integer number "N" of word lines, the length of the bit lines will have to double if N is increased to 2*N (assuming the same semiconductor process dimensions in both cases). The bit line capacitance will thus double as well, thereby decreasing the voltage change when a memory cell is accessed. As a result, the maximum number of memory cell rows per sense amplifier in a conventional trench-capacitor DRAM is limited to, for example, 512 rows per sense amplifier. The maximum number of memory cell rows per sense amplifier is much lower if storage transistors are used to form the memory cells such as a maximum of 8 to 16 rows.

One of the limiting factors in sensing ever-smaller voltage changes as DRAM density is increased is the non-ideal characteristic of sense amplifiers. A conventional sense amplifier 200 is illustrated in FIG. 2. This sense amplifier includes a differential amplifier 205 that compares a voltage P derived from bit line B (FIG. 1) at its positive input to a voltage N derived from bit line Bx (FIG. 1) at its negative input. If voltage P is higher than the voltage N, the voltage difference is amplified onto differential outputs P0 and N0 by the differential amplifier's gain. A regenerative latch 210 would then drive output P full rail to VDD and ground output N. Conversely, if voltage N is higher than voltage P, the regenerative latch drives output N full rail to VDD and grounds output P.

Should both differential inputs, however, be at the same voltage (such as the pre-charge voltage VDD/2), the regenerative latch operation just described may not take place correctly. Instead, because of offset imperfections in the differential amplifier, P0 (for example) output may be driven higher than N0 despite the equal voltages at the inputs. In turn, this offset limits the sensitivity of the sense amplifier operation. For example, suppose bit line B should be higher in voltage than bit line Bx during a read operation. If the storage capacitance is too small with regard to the bit line capacitance, the offset within the differential amplifier may drive the regenerative latch to pull output N full rail, leading to an erroneous reading.

It may be seen that other issues affect sense amplifier decisions. For example, suppose both bit lines are discharged to VSS (ground potential) prior to sensing. Such a scenario favors the sensing of charged memory cells as opposed to discharged memory cells. Conversely, if both bit lines are charged to VDD, the sensing of discharged memory cells is favored over charged memory cells. The favoring of one bit decision (declaring a binary one or a binary zero as the memory cell contents) over another may be exacerbated as density increases. Accordingly, there is a need in the art for improved DRAM architectures that address such common-mode effects on bit decisions.

As discussed above, the storage capacitance vs. bit line capacitance is a limiting factor for DRAM density. By increasing the storage capacitance, a sense amplifier can better decide what binary contents are being stored. However, the increased storage capacitance generally leads to increased memory cell size, thereby diminishing density. Accordingly, there is a need in the art for improved DRAM memory cell architectures that maximize achievable density.

SUMMARY

This section summarizes some features of the invention. Other features are described in the subsequent sections.

In accordance with a first aspect of the invention, a dynamic random access memory (DRAM) is provided that includes: a plurality of memory cells arranged into rows and columns, wherein each memory cell comprises an access transistor coupled to a storage transistor, each access transistor arranged in a rectangular shape having a length greater than a width, the length being aligned with a corresponding column, the access transistor coupling to a storage transistor having a width greater than the width of the rectangular shape, the access transistor having a length aligned with a corresponding row such that each memory cell is L-shaped, and wherein the L-shaped memory cells in each column are staggered with respect to neighboring columns such that the L-shaped memory cells in a given column are interlocked with the L-shaped memory cells in an adjacent column.

The invention is not limited to the features and advantages described above. Other features are described below. The invention is defined by the appended claims.

BRIEF DESCRIPTION OF THE DRAWINGS

FIG. 8 is a cross-sectional view of DRAM storage capacitors formed in the metal layers adjacent a substrate in accordance with an embodiment of the invention;

FIG. 9 is a plan view of a metal layer for the DRAM storage capacitors of FIG. 8 in accordance with an embodiment of the invention;

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 3:
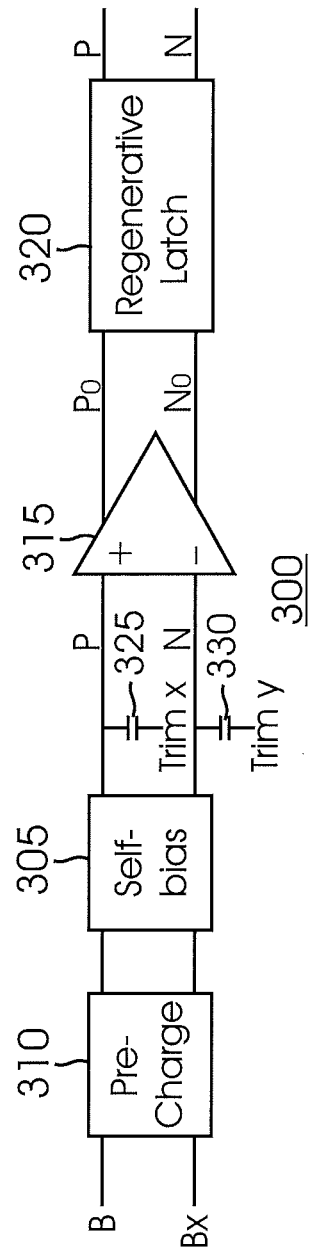
FIG. 3 illustrates a sense amplifier incorporating a self-bias generation circuit in accordance with an embodiment of the invention.

Turning now to FIG. 3, an improved sense amplifier 300 includes a self-bias generation circuit 305. The self-bias generation circuit complements the operation of a pre-charge circuit 310 that operates to charge a bit line B and a bit line Bx to VDD/2 prior to a read operation. Should the pre-charge circuit operate without the self-bias generation circuit, a differential amplifier 315 will, due to its offset, provide some voltage difference between a positive output P0 and a negative output N0 even though bit lines B and Bx are at the same voltage. To cancel this voltage difference, the voltages of bit lines B and Bx may be adjusted in a complementary fashion from VDD/2 so that the voltages of P0 and N0 are equal. In this manner, the differential amplifier may then immediately respond to any additional changes in the voltages of bit lines B and Bx due to a read operation by amplifying the additional change according to its internal gain. This amplified change is then applied across outputs P0 and N0 so that a regenerative latch 320 may drive its outputs P and N accordingly. Outputs P and N then couple back (coupling not illustrated) to the bit lines so that the appropriate voltage is restored on the storage capacitor that was just accessed.

Figure 4:
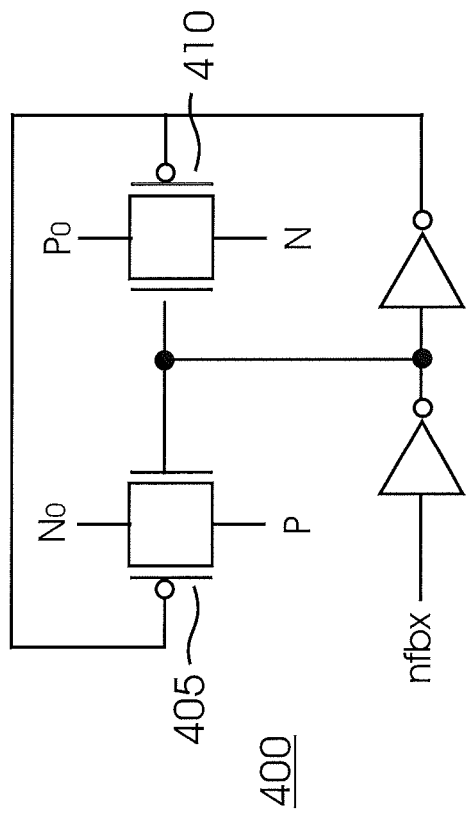
FIG. 4 illustrates a self-bias generation circuit in accordance with an embodiment of the invention.

An exemplary self-bias generation circuit 400 is illustrated in FIG. 4. Operation of circuit 400 may be isolated from the pre-charge operation. In other words, the pre-charge circuit of FIG. 3 charges the bit lines B and Bx to VDD/2 and then lets these lines float while the self-bias generation circuit operates to cancel the offset in the differential amplifier. Similarly, the self-bias generation circuit operation may be isolated from the raising of the word line voltage discussed with regard to FIG. 1—without such isolation, the voltage difference from the storage capacitor being accessed would be treated as an offset by the self-bias generation circuit and thereby erased. As seen in FIG. 4, transmission gates 405 and 410 are controlled by an active low signal nfbx. When signal nfbx is asserted (pulled low), transmission gate 405 becomes conductive such that the voltage of input P equals the voltage of output N0. Similarly, transmission gate 410 becomes conductive such that the voltage of input N equals the voltage of output P0. Referring again to FIG. 3, it may be seen that the resulting negative feedback through the differential amplifier dramatically reduces the effects of the voltage offset. For example, if the voltage offset is represented by ΔV, the relationship between the input and output voltages is given by:

$$G(V_P - V_N) + \Delta V = V_{P0} - V_{N0}$$

where G is the gain of the differential amplifier, $V_P$ and $V_N$ are the voltages at the input nodes P and N, respectively, and $V_{P0}$ and $V_{N0}$ are the voltages at the output nodes P0 and N0, respectively. Should $V_{P0}$ equal $V_N$ and $V_{N0}$ equal $V_P$ such as when the signal nfbx is asserted, the preceding equation leads to:

$$\Delta V/(G+1) = -(V_P - V_N)$$

As a result, the offset is reduced by the factor (G+1). Because the open loop gain G is large for a differential amplifier, the effect of the offset voltage is virtually eliminated. It will be appreciated that other topologies may be used for the self-bias generation circuit to eliminate the offset effect in this fashion.

Figure 2:
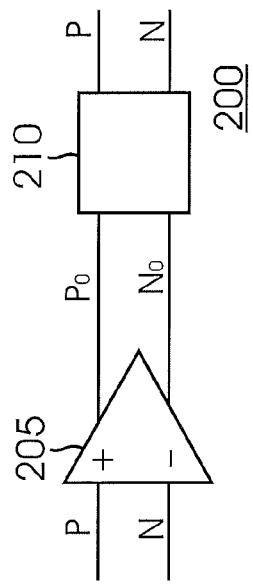
FIG. 2 illustrates a conventional sense amplifier.
Figure 1:
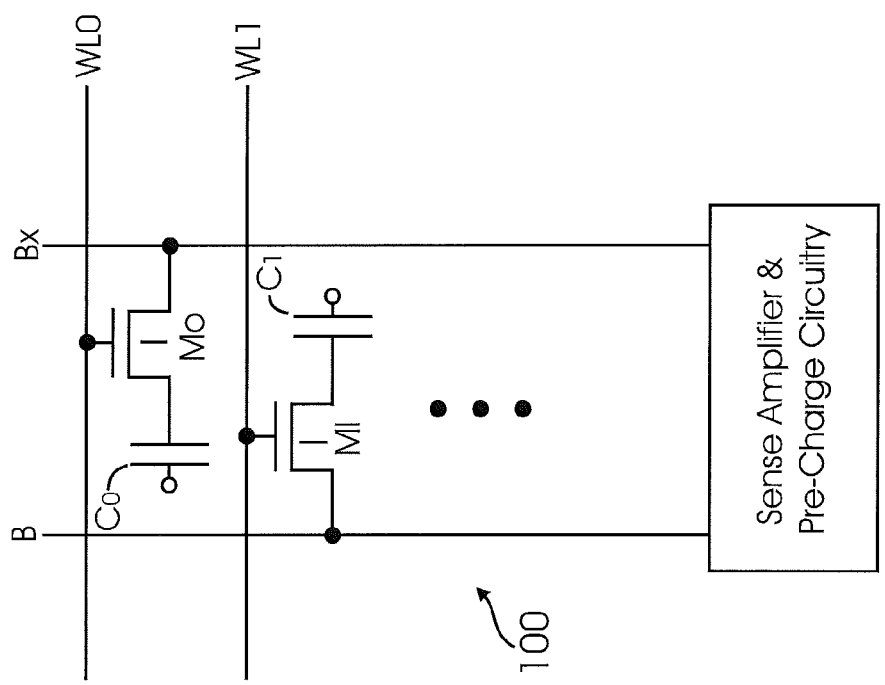
FIG. 1 illustrates a conventional DRAM.

Although the sense amplifier discussed with regard to FIG. 3 advantageously increases the sensitivity of its differential amplifier, the resulting biases may affect the margins regarding whether an accessed memory cell was storing a "1" or a "0." For example, as discussed with regard to the conventional sense amplifier of FIGS. 1 and 2, the bit lines are pre-charged to VDD/2. Such a bias neither favors a logical 1 nor a logical zero decision and is thus theoretically ideal. However, the self-bias generation circuit described herein will pull the bit lines away from this ideal bias point such that a logical 0 may be favored over a logical 1 decision (or vice versa). In general, the ideal bias point for a given differential amplifier will depend upon the relative strengths of its PMOS and NMOS transistors. In turn, these relative strengths are affected by the particular semiconductor process corner used to manufacture the transistors. A customer of a semiconductor foundry can never guarantee, a priori, what particular process corner will be used to manufacture a given batch of wafers. Thus, the relative margin between logical 0 and logical 1 decisions for a sense amplifier that includes a self-bias generation circuit may also be unpredictable.

As a result, although a sense amplifier with self-bias generation advantageously is more sensitive to the voltage differences produced by accessing a memory cell, the self-bias generation may push the sense amplifier into having less than ideal margins between logical 0 and logical 1 decisions. Referring again to FIG. 3, bit line B may include a trim circuit such as a trim capacitor 325 charged by an adaptive signal (trimx) such that a less-than-ideal margin may be optimized. Similarly, bit line Bx may include a trim capacitor 330 charged by an adaptive signal (trimy) to also optimize the margin. Upon manufacture of a DRAM having sense amplifiers with self-bias generation, a user may test the bit error rate for storing the binary states (logical 0 vs. logical 1). Should the bit error rate for storing, for example, a logical 0 in each memory cell be higher than when a logical 1 is stored, the adaptive signals trimx and trimy may be adjusted such that the bit error rate is minimized for both decisions. During idle states, the adaptive trim signals are not asserted. The adaptive trim signals may range through a binary-weighted range of values. Upon manufacture, the appropriate trim signal values to be applied after self-bias generation may be "burned" into the circuit using, for example, fuses or non-volatile memory. It will be appreciated that a trim circuit may be used in other memories such as SRAM or flash. For example, the trim circuit may comprise an adjustable current source should a memory use current sensing to make bit decisions. Regardless of the type of bias adjustment provided by a trim circuit coupled to a bit line (such as charge from a capacitor or current from a current source), the trim circuit may be adjusted by a controller depending upon the observed bit error rate to enhance performance. Moreover, a trim circuit may be used during debugging to test memory performance in response to trim-circuit-provided bit line bias adjustments.

The sense amplifier discussed with regard to FIG. 3 advantageously increases the sensitivity to the voltage differences produced by accesses to storage capacitors in a DRAM, thereby increasing the achievable storage capacity for a given die area dedicated to the DRAM. However, the additional self-bias generation circuit increases the die area needed to implement the sense amplifier. Referring back to FIG. 1, it may be seen that a DRAM sense amplifier must typically fit within the pitch between neighboring bit lines. Such a pitch continues to decrease as modern semiconductor processes go into the deep sub-micron regime. Thus, it may be difficult to implement a sense amplifier with self-bias generation in such narrow pitches.

Figure 5:
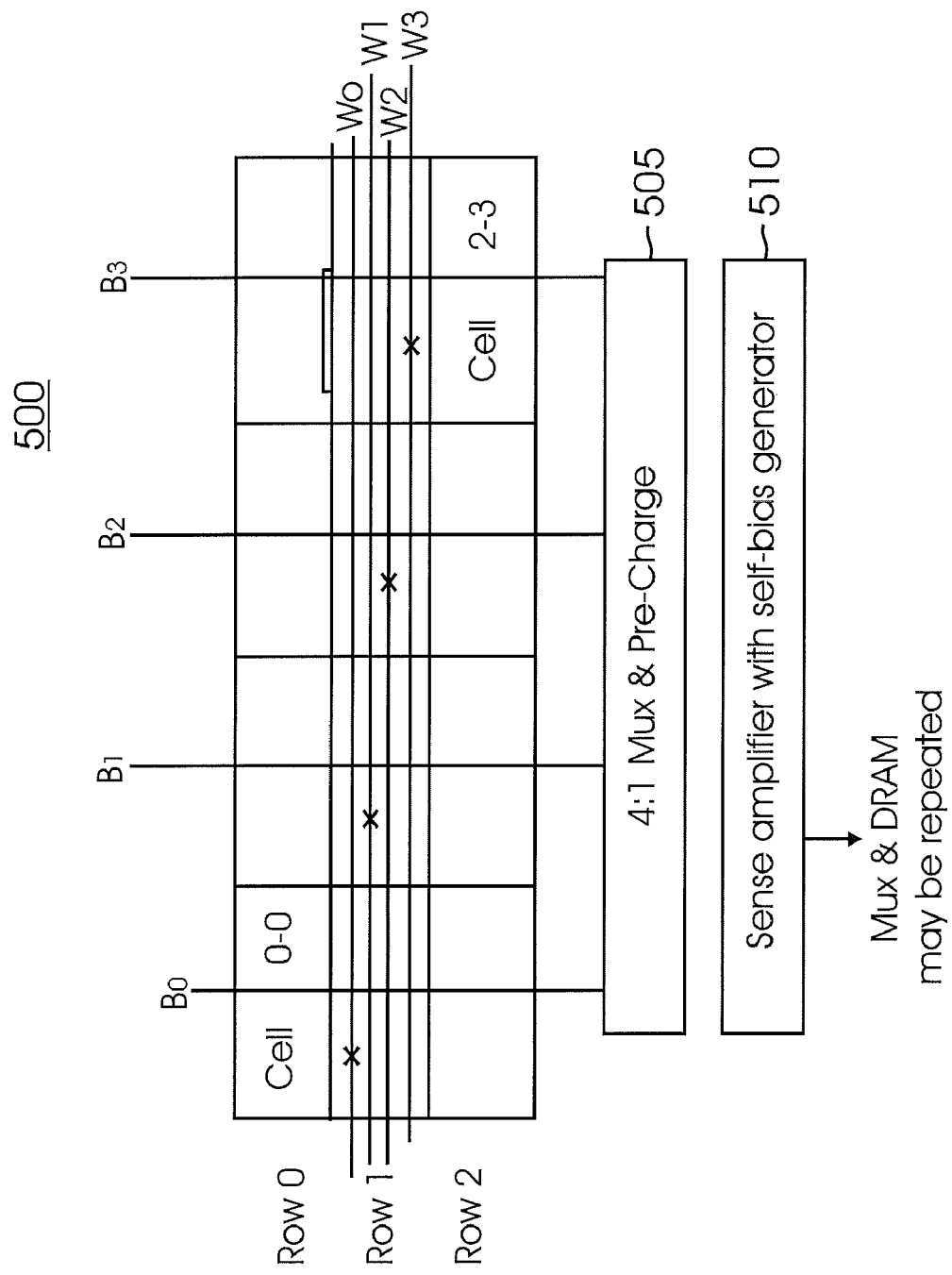
FIG. 5 illustrates a DRAM having multiple-word-lines-per-memory-row in accordance with an embodiment of the invention.

Turning now to FIG. 5, a DRAM having four word lines per memory cell row is illustrated that provides additional pitch space for a sense amplifier 510. For illustration clarity, only three memory cell rows are shown, ranging from a zeroth row to a second row. Similarly, only four memory cells are shown per row, such as cell 0-0 in the zeroth row and a cell 2-3 in the second row. The four memory cells in each row are arranged in columns, each column having a bit line. Thus, a zeroth column has a bit line B0 and so on such that a third column has a bit line B3. A multiplexer 505 selects between pairs of neighboring bit lines for processing by a sense amplifier with self-bias generation 510. Each row of memory cells has four word lines. For illustration clarity, only word lines W0 through W3 are illustrated for row 1. Each word line only couples to one memory cell in each group of four memory cells. For example, word line W0 couples to the zeroth cell in row 1. Word line W1 couples to the first cell in row 1. Word line W2 couples to the second cell in row 1. Finally, word line W3 couples to the third cell in row 1.

The multiplexer is controlled such that if the zeroth cell in row 1 is to be accessed, bit lines B0 and B1 are selected for processing. Similarly, these same lines are selected if the first cell in row 1 is to be accessed. However, if either the second or third cells in row 1 are to be accessed, bit lines B2 and B3 are selected for processing. Because only one cell out of each group of four in each row is accessed at any given time, multiplexer 505 acts as a 4:1 multiplexer. However, in other embodiments, the multiplexing may differ such as an 8:1 multiplexer. It will be appreciated, however, that an 8:1 multiplexing would require 8 word lines per row. Additional density may be achieved by duplicating the multiplexer and DRAM structure on the other side of the sense amplifier as indicated by the arrow in FIG. 5. Because four word lines cross each row of cells in DRAM 500, the word lines may twist across metal layers to minimize coupling between adjacent word lines. For example, word line 0 may be implemented in a first metal layer across a first number of cells and then switch through a via into a second metal layer across a second number of cells. At this switch point, another word line such as word line 3 that had crossed the first number of cells in the second metal layer switches through a via into the first metal layer to cross the second number of cells. Thus, word lines 1 and 3 would "twist" with regard to each other at their vias. In addition, inactive word lines may be strapped to ground through strapping transistors.

Figure 6:
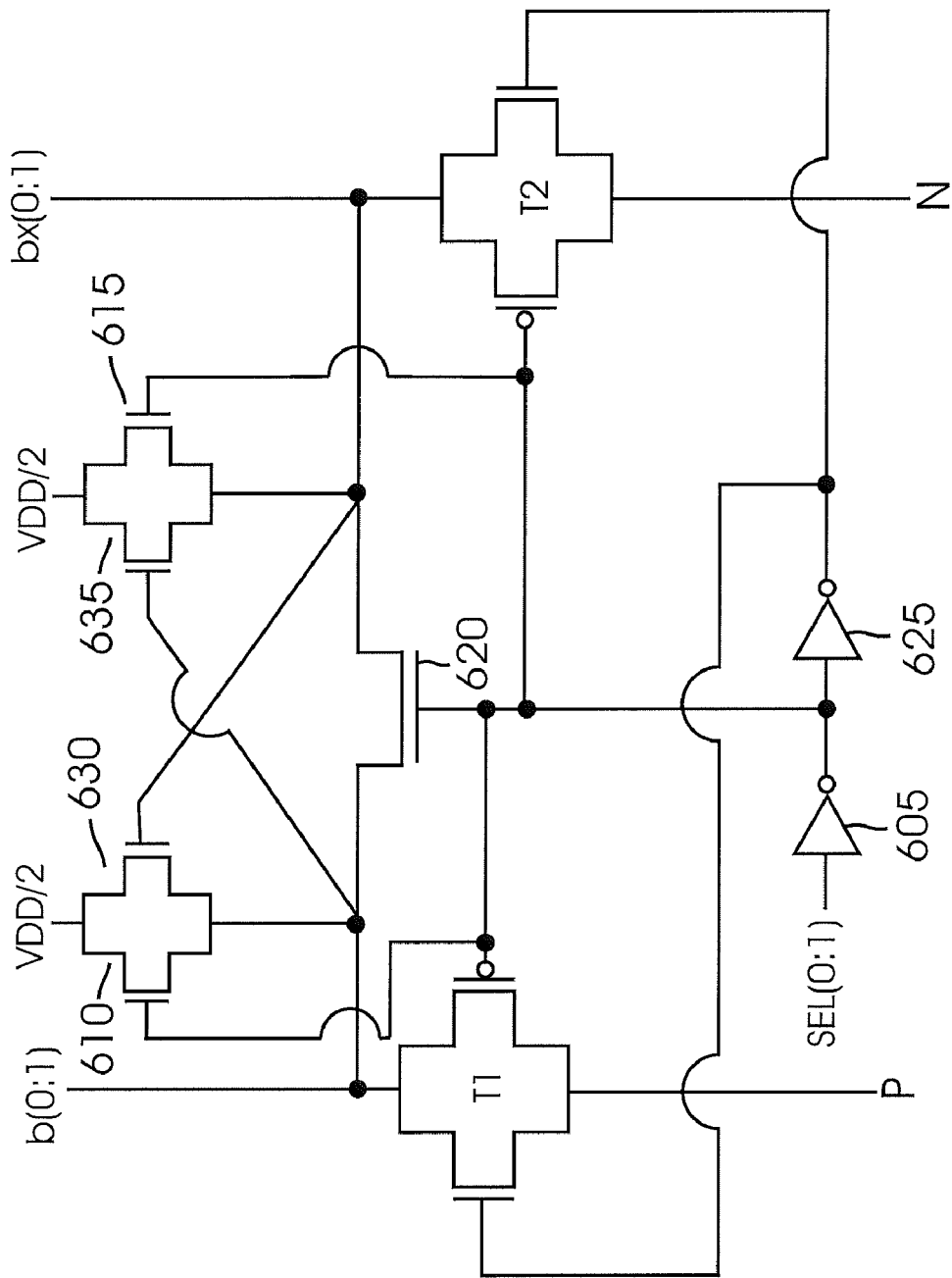
FIG. 6 illustrates a multiplexer and pre-charging circuit in accordance with an embodiment of the invention.

The multiplexer may also include pre-charging circuitry. An exemplary multiplexer and pre-charging circuit 600 is illustrated in FIG. 6. For illustration clarity, only one half of circuit 600 is illustrated, the remaining half being symmetric. Thus, just a first bit line b[0:1] and a second bit line bx[0:1] are shown. Each bit line is pre-charged when a selection signal SEL is not asserted (active high). Because signal SEL(0:1) is inverted at a first inverter 605, it will turn on transistors 610 and 615 when this signal is not asserted. Thus each bit line will pre-charge to VDD/2, the theoretically ideal bias point discussed previously. To assure balance, a balance transistor 620 also conducts at this time to equalize the charge on each bit line. When signal SEL(0:1) is asserted, it will cause a transmission gate T1 and T2 to conduct because of the re-inversion at a second inverter 625. The pre-charged bit lines will then couple to input nodes P and N discussed previously.

After processing the voltages on nodes P and N, the bit lines will be pulled full rail in a complementary fashion through the regenerative latching action of a sense amplifier (not illustrated). Suppose bit line b[0:1] is thus to be grounded. Referring again to FIG. 1, the corresponding access transistor may then leak, despite having its gate and source grounded. To reduce this leakage, the access transistor may be given a negative gate-to-source voltage ($V_{gs}$) by preventing the regenerative latch from fully grounding this bit line. To prevent this full ground, each bit line may couple through a weak transistor to VDD/2.

For example, bit line b[0:1] couples through a weak transistor 630 whereas bit line bx[0:1] couples through a weak transistor 635. Within each bit line pair, the gate of each weak transistor for a bit line is controlled by the voltage on remaining bit line. Because the bit lines are pulled full rail in a complementary fashion, should a bit line be pulled to ground by the regenerative latching action, its weak transistor will attempt to pull the bit line towards Vdd/2. In this fashion, through appropriate selection of the weak transistor dimensions, the access transistor for a "grounded" bit line may have a Vgs of, for example, approximately –200 to –300 millivolts, thereby greatly reducing leakage current from the corresponding column of inactive access transistors.

Referring again to FIG. 5, the use of four or more word lines per row provides a pitch of at least 4 bit lines in width for the sense amplifier. In this manner, sufficient die space to implement the self-bias generation in modern deep sub-micron semiconductor processes is enabled.

Advantageously, the DRAM memory and sense amplifier architecture discussed herein may be used to implement an embedded DRAM memory using conventional CMOS semiconductor processing techniques. Because such conventional techniques do not allow density-enhancing DRAM trench capacitor implementations, the storage capacitors in such embedded DRAM memories may be implemented using a thick gate oxide transistor. Despite the die area demands of using thick gate oxide transistors to implement the storage capacitors, density is enhanced because a sense amplifier with self-bias generation may service substantially more memory rows than a conventional embedded DRAM implementation. It will be appreciated, however, that the architectures discussed herein may also be used with other storage capacitors such as trench capacitors.

Figure 7:
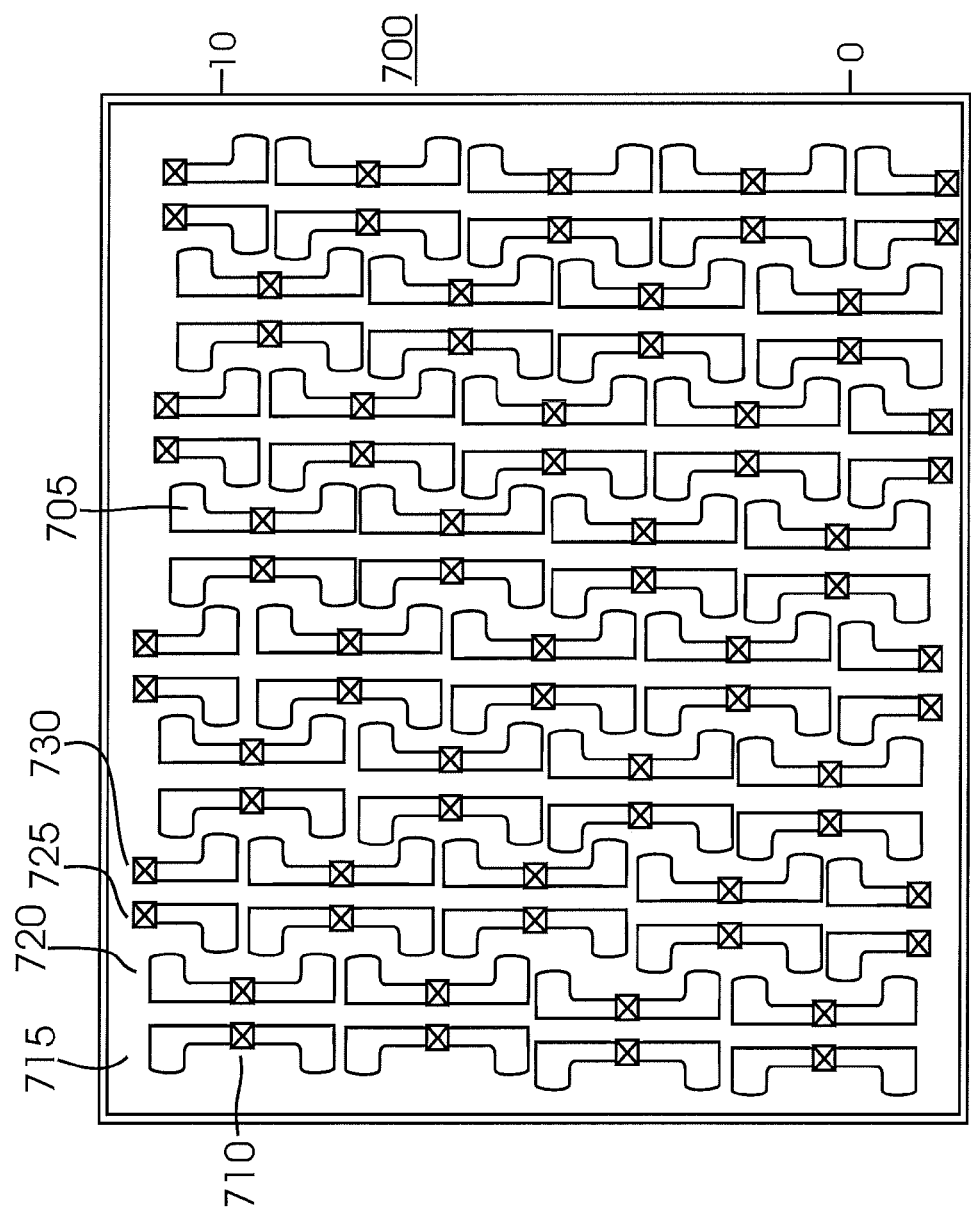
FIG. 7 illustrates a DRAM memory cell layout in accordance with an embodiment of the invention.

Because a transistor-implemented storage capacitor demands more die area than trench capacitors, the layout of the memory cells may be important to provide the most efficient use of available die area. Turning now to FIG. 7, an interlocking "L-shaped" memory cell architecture is illustrated for a four-word-line-per-memory-row DRAM 700. The base of each L shape is formed by a thick field oxide transistor 705 acting as a storage capacitor. The access transistor forms the stem of each L shape. By coupling each L-shaped memory cell to an opposing L-shaped memory cell at a bit line contact via 710, the coupled memory cells form a rectangular C shape. Although these coupled cells share a bit line, they are coupled to different word lines (not illustrated). The rectangular C shape is duplicated in a neighboring column in a mirror-image fashion such as seen in columns 715 and 720. A pair of immediately-neighboring columns 725 and 730 are formed analogously but staggered with regard to columns 715 and 720 such that the L shapes in columns 720 and 725 interlock. In this fashion, die space is efficiently used for a 4-word-line-per-memory row architecture. It will be appreciated, however, that the interlocking L-shaped layout for memory 700 may be applied to DRAM architectures that do not incorporate multiple word lines per row.

Although the L-shaped layout for memory 700 advantageously increases density, the storage transistor in each memory cell still demands an appreciable die area. In addition, these storage transistors will continually conduct leakage current, a current loss that is exacerbated as transistor dimensions move into the deep sub-micron regime. Turning now to FIG. 8, a cross-sectional view of a DRAM storage capacitor 800 is illustrated using the conventional metal layers available in CMOS and other semiconductor processes. The number of metal layers available depends upon the particular semiconductor process being implemented is represented by an integer N. Thus, the metal layers range from a first metal layer M1 separated from a substrate 805 by a first field oxide layer FOX1 to a final metal layer MN separated from an underlying metal layer (not illustrated) by a field oxide layer FOXN. As seen also in the plan view of FIG. 9, each metal layer forms an inner node plate 805 surrounded by a mesh 810, which acts as a common outer node to all the inner node plates. At least one via 820 joins inner node plates 820 to a source of an access transistor as described with regard to FIG. 1.

Figure 11:
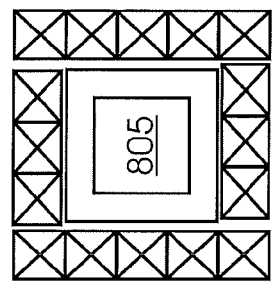
FIG. 11 illustrates another via arrangement for a metal layer of FIG. 8 in accordance with an embodiment of the invention.
Figure 10:
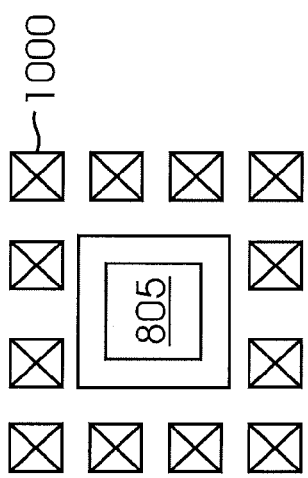
FIG. 10 illustrates the via arrangement for a metal layer of FIG. 8 in accordance with an embodiment of the invention.
Figure 12:
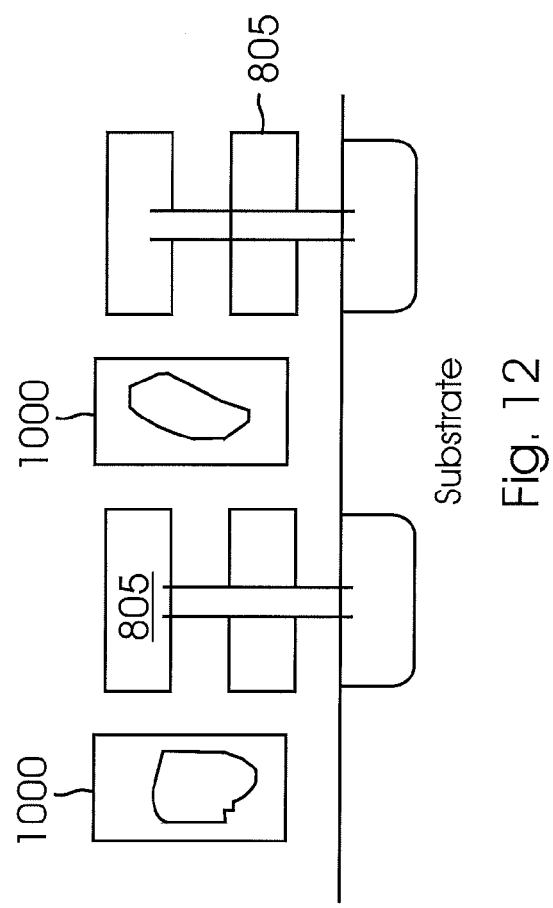
FIG. 12 is a cross-sectional view of DRAM storage capacitors having the via arrangement of FIG. 11. in accordance with an embodiment of the invention.

The common outer nodes in adjacent metal layers are joined through a plurality of vias 1000 as illustrated in FIG. 10. Advantageously, because a DRAM storage capacitor needs to conduct very little current, semiconductor fab design rules may be violated such that the common outer node forms a hollow cylinder about each stack of inner node plates. In other words, the vias are placed immediately adjacent each other and also the width of each via is adjusted so that it matches the width of the common outer node between adjacent inner node plates as seen in plan view in FIG. 11 and cross-sectional view in FIG. 12 (for illustration clarity, only two metal layers are shown in FIG. 12). Because design rules may be violated to produce vias 1000 of such width, thereby resulting in voids internally to vias 1000, such voids will have no real effect because of the very small currents that flow through a DRAM storage capacitor. Moreover, even if the capacitance provided by any one metal layer is not sufficient, the total capacitance provided by all the metal layers used to form storage capacitor 800 (for example, eight metal layers) is sufficient, even in high density (small separation between inner node plates) designs.

Increased density is not the only advantage of storage capacitor 800. In addition, although field oxide is lower quality than the gate oxide used in a storage transistor, the field oxide layers are so much thicker than gate oxide thicknesses as to reduce leakage current as compared to a storage transistor implementation.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

The invention claimed is:

1. A dynamic random access memory (DRAM), comprising:
    a plurality of memory cells arranged into rows and columns,
    wherein each memory cell comprises an access transistor coupled to a storage transistor, each access transistor being arranged in a rectangular shape having a length greater than a width, the length being aligned with a corresponding column, the access transistor coupling to a storage transistor having a width greater than the width of the rectangular shape, the access transistor having a length aligned with a corresponding row such that each memory cell is L-shaped, and wherein the L-shaped memory cells in each column are staggered with respect to neighboring columns such that the L-shaped memory cells in a given column are interlocked with the L-shaped memory cells in an adjacent column;

a differential amplifier adapted to amplify an input voltage difference ($V_P - V_N$) between a pair of bit lines, wherein a first one of the bit lines is charged to the voltage $V_P$ and a second one of the bit lines is charged to the voltage $V_N$, the differential amplifier amplifying the input voltage difference according to a gain G so as to drive an output voltage difference ($V_{PO} - V_{NO}$) between a pair of output nodes, wherein a first one of the output nodes is charged to the voltage $V_{PO}$ and a second one of the output nodes is charged to the voltage $V_{NO}$, the differential amplifier having a non-zero offset bias voltage ($\Delta V$) such that if the input voltage difference is zero, the output voltage difference is non-zero; and a self-bias generation circuit adapted to couple the first output node to the second bit line such that the output voltage $V_{PO}$ equals the input voltage $V_N$ and to couple the second output node to the first bit line such that the output voltage $V_{NO}$ equals the input voltage $V_P$, the offset bias voltage $\Delta V$ thereby being reduced responsive to the gain G.

2. The DRAM of claim 1, wherein the L-shaped memory cells in each column are arranged in pairs such that an end of a first L-shaped memory cell in each pair couples to an end of a remaining L-shaped memory cell in the pair in an end-to-end fashion such that each pair forms a C-shaped memory cell pair.

3. The DRAM of claim 2, wherein the L-shaped memory cells in each pair couple to each other through a bit line contact.

4. The DRAM of claim 2, wherein the C-shaped memory cell pairs in a first column face a first direction, the C-shaped memory cell pairs in an adjacent second column face an opposing second direction, and so on, such that the C-shaped memory cell pairs in neighboring columns face in opposite directions.

5. The DRAM of claim 4, wherein the C-shaped memory pairs in a given column interlock with the C-shaped memory pairs in a neighboring column such that for a given C-shaped memory pair in a given column, an first and second end of two C-shaped memory pairs in a neighboring column fit between the ends of the given C-shaped memory pair.

6. The DRAM of claim 1, wherein each row is crossed by a plurality of word lines.

7. The DRAM of claim 6, wherein the plurality of word lines is four.

8. The DRAM of claim 7, wherein each column corresponds with a bit line, the DRAM further comprising:

a plurality of sense amplifiers corresponding to the bit lines such that a single sense amplifier corresponds to every four bit lines; and a plurality of 4:1 multiplexers corresponding to the plurality of sense amplifiers, each 4:1 multiplexer coupling its corresponding sense amplifier to its corresponding four bit lines.

9. The DRAM of claim 8, wherein each row of four word lines is arranged into two pairs such that a first pair of word lines in each row couples to a first word line driver through a first semiconductor process metal layer and a remaining pair of word lines in each row couples to a second word line driver through a second semiconductor process metal layer, the second semiconductor process metal layer being separated from the first semiconductor process layer by at least one insulating layer.

10. The DRAM of claim 9, further comprising a strapping transistor arranged such that the assertion of one of the word lines in one of the pairs will drive the strapping transistor to couple the remaining word line in the one pair to ground.

11. The DRAM of claim 1, wherein each access transistor and storage transistor are thick-gate I/O devices.

* * * * *